United States Patent
Lee et al.

(10) Patent No.: US 9,608,632 B1
(45) Date of Patent: Mar. 28, 2017

(54) RESISTANCE CALIBRATION METHOD AND RELATED CALIBRATION SYSTEM

(71) Applicant: NOVATEK Microelectronics Corp., Hsin-Chu (TW)

(72) Inventors: Chien-Hsi Lee, Miaoli County (TW); Yao-Cheng Chuang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 14/854,032

(22) Filed: Sep. 14, 2015

(51) Int. Cl.
*H03K 19/003* (2006.01)
*H03K 19/00* (2006.01)
*G11C 7/10* (2006.01)

(52) U.S. Cl.
CPC ................ *H03K 19/0005* (2013.01)

(58) Field of Classification Search
CPC ... G11C 7/1057; G11C 29/021; G11C 29/028; H03K 19/0005

USPC ......................... 326/30, 21, 23, 82
See application file for complete search history.

(56) References Cited

U.S. PATENT DOCUMENTS

| | | | |
|---|---|---|---|
| 7,408,378 B2 * | 8/2008 | Best | H04L 25/0278 326/30 |
| 7,741,868 B2 | 6/2010 | Nguyen | |
| 9,118,313 B2 | 8/2015 | Lee | |
| 2011/0074520 A1 | 3/2011 | Tyan | |
| 2013/0182513 A1 * | 7/2013 | Eom | H03K 19/0005 365/189.07 |

\* cited by examiner

*Primary Examiner* — Daniel D Chang
(74) *Attorney, Agent, or Firm* — Winston Hsu; Scott Margo

(57) ABSTRACT

A resistance calibration method for a first resistor of a first module includes performing resistance calibration on a calibration unit of a second module, wherein the first module is connected to the second module via a pad coupled to the first resistor and the calibration unit is coupled to the pad; obtaining a resistance value of the calibration unit after the resistance calibration; and calibrating a resistance value of the first resistor according to the resistance value of the calibration unit.

17 Claims, 5 Drawing Sheets

RESISTANCE CALIBRATION METHOD AND RELATED CALIBRATION SYSTEM

BACKGROUND OF THE INVENTION

1. Field of the Invention

The present invention relates to a resistance calibration method and a calibration system, and more particularly, to a resistance calibration method and a calibration system capable of reducing the usage of external reference resistors and dummy pads.

2. Description of the Prior Art

On-die termination (ODT) is the technology where the termination resistor for impedance matching in transmission lines is located inside a semiconductor chip instead of on a printed circuit board (PCB). In order for a transmission line to minimize distortion of the signal, the impedance of every location on the transmission line should be uniform throughout its length. If there is any place in the line where the impedance is not uniform for some reason (e.g., open circuit, impedance discontinuity, different materials), the signal gets modified by reflection at the impedance change point which results in distortion, ringing and so forth. In order to avoid impedance mismatch, termination impedance with the equivalent amount of impedance should be placed at the end point of the transmission line. This is described as "termination". There are several ways of termination depending on how the resistors are connected to the transmission line. Parallel termination and series termination are examples of termination methodologies.

Instead of having the necessary resistive termination located on the motherboard, the termination located inside the semiconductor chips is called ODT. In order to achieve better signal integrity and higher operational speed of data buses, the accurate ODT values are necessary. The conventional ODT calibration implementation is accomplished with an external reference resistor, which is connected to the chip via a dummy pad. A resistor coupled to the dummy pad is calibrated with the external resistor, and then the resistance setting of the dummy pad is duplicated to other pins on the chip, to realize the ODT calibration on all pins.

However, according to the conventional ODT calibration method, the external reference resistor and the corresponding dummy pad is always required for each chip on the PCB. Thus, there is a need to provide another resistance calibration method, in order to reduce the usage of external reference resistors and decrease the pin number of the chip, and thereby save the cost and area on the PCB.

SUMMARY OF THE INVENTION

It is therefore an objective of the present invention to provide a resistance calibration method and a calibration system capable of calibrating resistors on a first module according to the resistance values of a calibration unit in a second module, in order to reduce the usage of external resistors and corresponding dummy pads.

The present invention discloses a resistance calibration method for a first resistor of a first module. The resistance calibration method comprises performing resistance calibration on a calibration unit of a second module, wherein the first module is connected to the second module via a pad coupled to the first resistor and the calibration unit is coupled to the pad; obtaining a resistance value of the calibration unit after the resistance calibration; and calibrating a resistance value of the first resistor according to the resistance value of the calibration unit.

The present invention further discloses a resistance calibration method for a plurality of first resistors of a first module. The resistance calibration method comprises performing resistance calibration on a plurality of calibration units of a second module, wherein the first module is connected to the second module via a plurality of pads, each of which is coupled to at least one of the plurality of first resistors, and each of the plurality of calibration units is coupled to one of the plurality of pads; obtaining resistance values of the plurality of calibration units after the resistance calibration; and calibrating a resistance value of each of the plurality of first resistors according to the resistance value of a corresponding calibration unit among the plurality of calibration units.

The present invention further discloses a calibration system. The calibration system comprises a first module and a second module. The first module comprises a first resistor to be calibrated and a calibration circuit. The first resistor is coupled to a pad. The calibration circuit is coupled to the first resistor. The second module comprises a calibration unit coupled to the pad, wherein the calibration unit is calibrated by an external resistor to obtain a resistance value. The calibration circuit calibrates a resistance value of the first resistor according to the resistance value of the calibration unit.

These and other objectives of the present invention will no doubt become obvious to those of ordinary skill in the art after reading the following detailed description of the preferred embodiment that is illustrated in the various figures and drawings.

DETAILED DESCRIPTION

According to embodiments of the present invention, in a calibration system on a printed circuit board (PCB), the resistors in a first module, e.g., a first chip, may be calibrated according to the calibration results of a second module, e.g., a second chip. Therefore, the on-die termination (ODT) calibration of the first module may be realized without the usage of an external resistor and a corresponding dummy pad. More specifically, a calibration unit of the second module may be utilized for calibrating the resistors in the first module. In detail, the resistors in the calibration unit may be calibrated with an external reference resistor. After being calibrated, the resistance value of the resistors in the calibration unit may become accurate. Therefore, the accurate resistance value of the resistors in the calibration unit may be utilized for calibrating the resistors in the first module.

Figure 1:
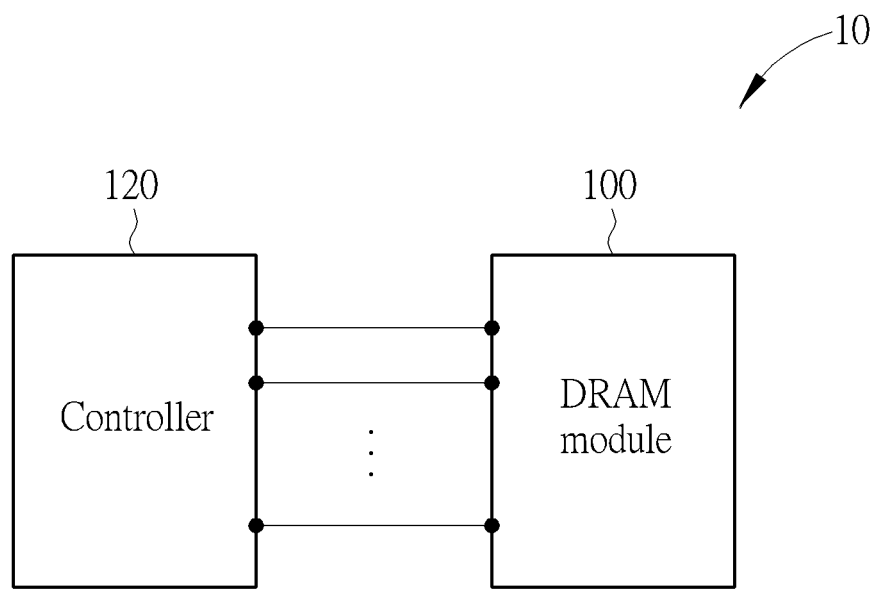
FIG. 1 is a schematic diagram of a DRAM control system according to an embodiment of the present invention.

Take a dynamic random access memory (DRAM) control system as an example. Please refer to FIG. 1, which is a schematic diagram of a DRAM control system 10 according to an embodiment of the present invention. As shown in FIG. 1, the DRAM control system 10, which may be regarded as a calibration system of the present invention, includes a DRAM module 100 (i.e., the second module) and a controller 120 (i.e., the first module). The controller 120 is utilized for controlling data storage in the DRAM module 100. In detail, the DRAM module 100 includes a plurality of data pins, which are coupled to a plurality of control pins of the controller 120, respectively. Each data pin of the DRAM module 100 is coupled to one of the control pins of the controller 120 via a pad. The connection between a data pin and a control pin is detailed in FIG. 2.

Figure 2:
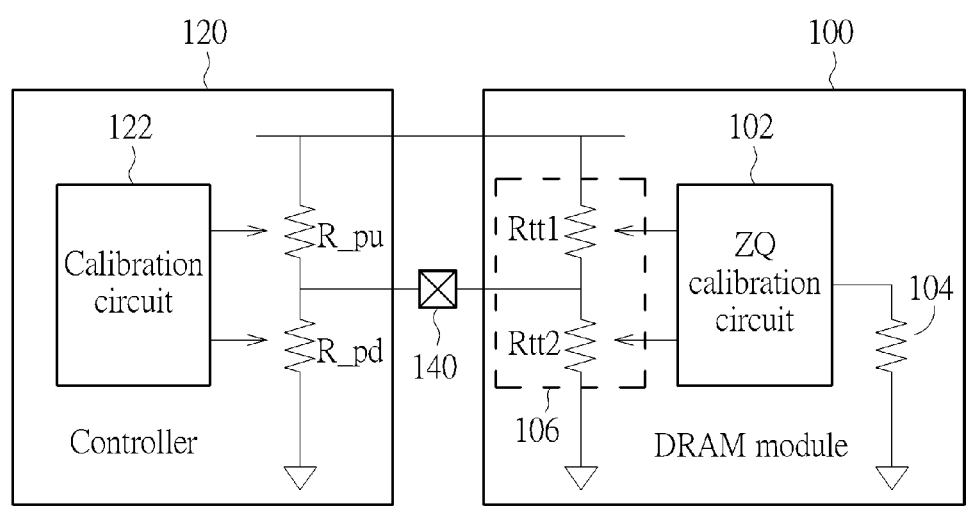
FIG. 2 is a schematic diagram of a connection between a data pin of the DRAM module and a control pin of the controller.

As shown in FIG. 2, the DRAM module 100 includes a ZQ calibration circuit 102, a resistor 104 and a calibration unit 106. The calibration unit 106 includes resistors Rtt1 and Rtt2. The ZQ calibration circuit 102 is utilized for performing resistance calibration on the resistors Rtt1 and Rtt2 in the calibration unit 106 with the externally connected resistor 104 as a reference resistor, where the resistor 104 has a resistance value equal to 240Ω for ZQ calibration in the DRAM module 100. The controller 120 includes a pull-up resistor R_pu, a pull-down resistor R_pd and a calibration circuit 122. The calibration circuit 122 is used for calibrating the resistance values of the resistors R_pu and R_pd according to the resistance values of the resistors Rtt1 and Rtt2 in the calibration unit 106. A pad 140 is disposed as a medium for connection between the DRAM module 100 and the controller 120.

In the DRAM control system 10, the conventional ODT is performed on each data pin of the DRAM module 100. In such a situation, the resistance values of resistors in the calibration unit 106 corresponding to each data pin should be accurate. Since the data pins are coupled to the control pins of the controller 120 via pads, the calibration of the resistors on the control pins may be realized by the accurate resistors on the corresponding data pins of the DRAM module 100, where the resistors on the data pins may be regarded as reference resistors which provide reference resistance values for the calibration on the corresponding control pins. Thus, the external reference resistor and corresponding dummy pad for the calibration of the controller 120 may be omitted. The cost and area on the PCB may thereby be saved.

In order to calibrate the resistance value of the pull-up resistor R_pu or the pull-down resistor R_pd based on the resistance values of the resistors Rtt1 and Rtt2 in the calibration unit 106, the calibration circuit 122 may determine a specific voltage value corresponding to a target resistance value of the pull-up resistor R_pu or the pull-down resistor R_pd. Taking the pull-up resistor R_pu as an example, the calibration circuit 122 determines a specific voltage value corresponding to a target resistance value of the pull-up resistor R_pu, and then adjusts the resistance value of the pull-up resistor R_pu toward the target resistance value. In such a situation, the voltage value of an output voltage generated from the pad varies in response to the variation of the resistance value of the pull-up resistor R_pu, where the pad is connected between the pull-up resistor R_pu and the reference resistors Rtt1 and Rtt2. The calibration circuit 122 then detects the output voltage of the pad to determine the resistance value of the pull-up resistor R_pu. More specifically, the calibration circuit 122 determines that the resistance value of the pull-up resistor R_pu reaches the target resistance value when the voltage value of the output voltage reaches the specific voltage value.

Figure 3:
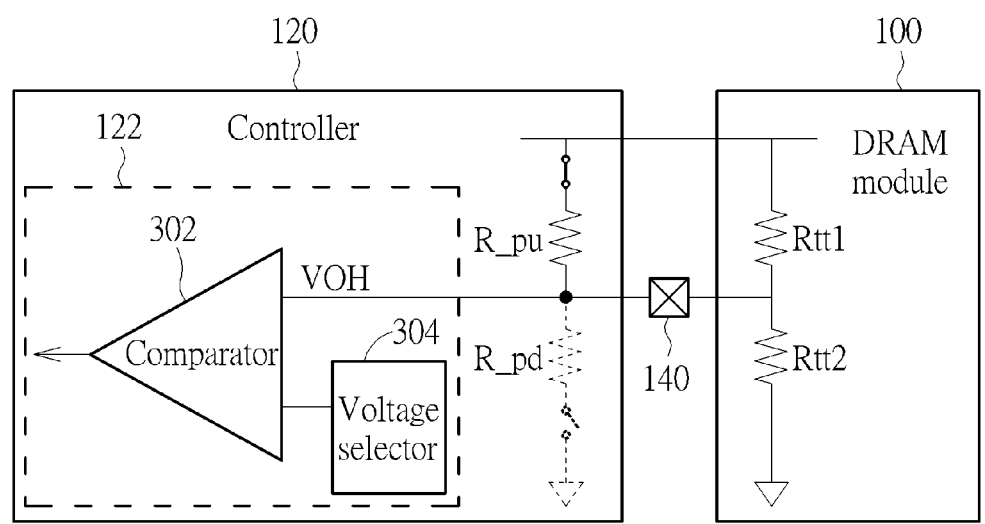
FIG. 3 is a schematic diagram of an implementation and operation of the calibration circuit.

Please refer to FIG. 3, which is a schematic diagram of an implementation and operation of the calibration circuit 122. As shown in FIG. 3, the calibration circuit 122 includes a comparator 302 and a voltage selector 304. The pull-up resistor R_pu is connected between the pad and a power supply terminal, which supplies a voltage having a value VDDIO. In order to calibrate the pull-up resistor R_pu, the pull-down resistor R_pd is disconnected. The voltage selector 304 may select to output a specific voltage having a value between VDDIO and zero according to the target resistance value of the pull-up resistor R_pu. The comparator 302 then compares the voltage value VOH of the output voltage outputted from the pad with the specific voltage value generated from the voltage selector 304. Therefore, the resistance value of the pull-up resistor R_pu will be determined to reach the target resistance value when the output value of the comparator 302 changes. Supposing that the pull-up resistor R_pu has a value $R_{pu}$ and the reference resistors Rtt1 and Rtt2 have a value $R_{tt}$, the voltage value VOH of the pad can be calculated as follows:

$$VOH = \frac{R_{tt}}{R_{pu} // R_{tt} + R_{tt}} \times VDDIO = \frac{R_{tt} + R_{pu}}{2 \times R_{pu} + R_{tt}} \times VDDIO$$

For example, if the target resistance value of the pull-up resistor R_pu is equal to $R_{tt}$, the specific voltage value outputted by the voltage selector 304 may be obtained by allowing $R_{pu}=R_{tt}$ in the above equation, which obtains VOH=⅔×VDDIO. Therefore, the voltage selector 304 can be configured to output a voltage value ⅔×VDDIO, in order to calibrate the pull-up resistor R_pu to have an accurate resistance value equal to $R_{tt}$.

Figure 4:
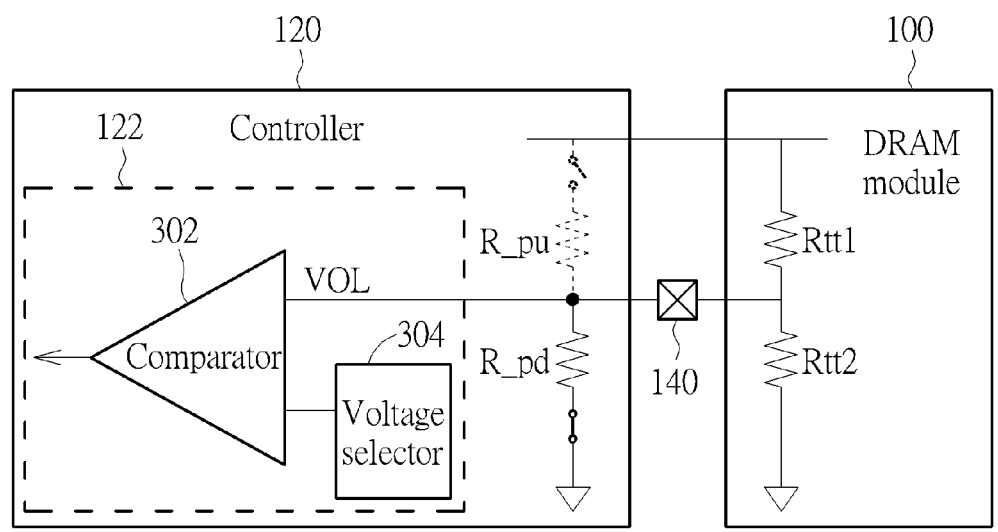
FIG. 4 is a schematic diagram of another operation of the calibration circuit.

Please note that the comparator 302 and the voltage selector 304 of the calibration circuit 122 may also calibrate the pull-down resistor R_pd in the same manner. In detail, please refer to FIG. 4, which is a schematic diagram of another operation of the calibration circuit 122. As shown in FIG. 4, in order to calibrate the pull-down resistor R_pd, the pull-up resistor R_pu is disconnected. The comparator 302 compares the voltage value VOL of the output voltage outputted from the pad with the specific voltage value generated from the voltage selector 304. Therefore, the resistance value of the pull-down resistor R_pd will be determined to reach the target resistance value when the output value of the comparator 302 changes. Supposing that the pull-down resistor R_pd has a value $R_{pd}$ and the reference resistors Rtt1 and Rtt2 have a value $R_{tt}$, the voltage value VOL of the pad can be calculated as follows:

$$VOL = \frac{R_{pd} // R_{tt}}{R_{pd} // R_{tt} + R_{tt}} \times VDDIO = \frac{R_{pd}}{2 \times R_{pd} + R_{tt}} \times VDDIO$$

For example, if the target resistance value of the pull-down resistor R_pd is equal to $R_{tt}$, the specific voltage value outputted by the voltage selector 304 may be obtained by allowing $R_{pd}=R_{tt}$ in the above equation, which obtains VOL=⅓×VDDIO. Therefore, the voltage selector 304 can be configured to output a voltage value ⅓×VDDIO, in order to calibrate the pull-down resistor R_pd to have an accurate resistance value equal to $R_{tt}$.

Please note that the present invention provides a resistance calibration method and a calibration system, which are capable of performing resistance calibration to achieve a benefit of reducing the external resistors and corresponding dummy pads. Those skilled in the art can make modifications and alternations accordingly. For example, the above embodiments illustrate the calibration performed on the controller via the reference resistors in the DRAM module. In another embodiment, the proposed calibration method may be performed on the resistors in the DRAM module via the reference resistors in the controller. In addition, the above calibration method may also be applied to another circuit system other than the DRAM system. For example, the first module may be an output driver of a chip, and the second module may be a load of the output driver. In such a situation, the proposed calibration method may be performed on the output resistors of the output driver according to the reference resistance values of the load.

Furthermore, in the DRAM control system 10, there is a multi-pin connection between the DRAM module 100 and the controller 120. The abovementioned calibration method as illustrated by FIGS. 2-4 may be applied to all control pins of the controller 120. The calibration of each control pin may be performed simultaneously, or performed in a specific order. For anyone of the control pins, the calibration may be performed periodically, in order to allow the resistance values of the pull-up resistor R_pu and the pull-down resistor R_pd to vary adaptively to temperature variations or other environmental factors. According to the resistance calibration method of the present invention, if the resistance values of the resistors Rtt1 and Rtt2 in the DRAM module 100 are accurate, the resistance values of the pull-up resistor R_pu and the pull-down resistor R_pd in the controller 120 will be accurate as well.

Figure 5:
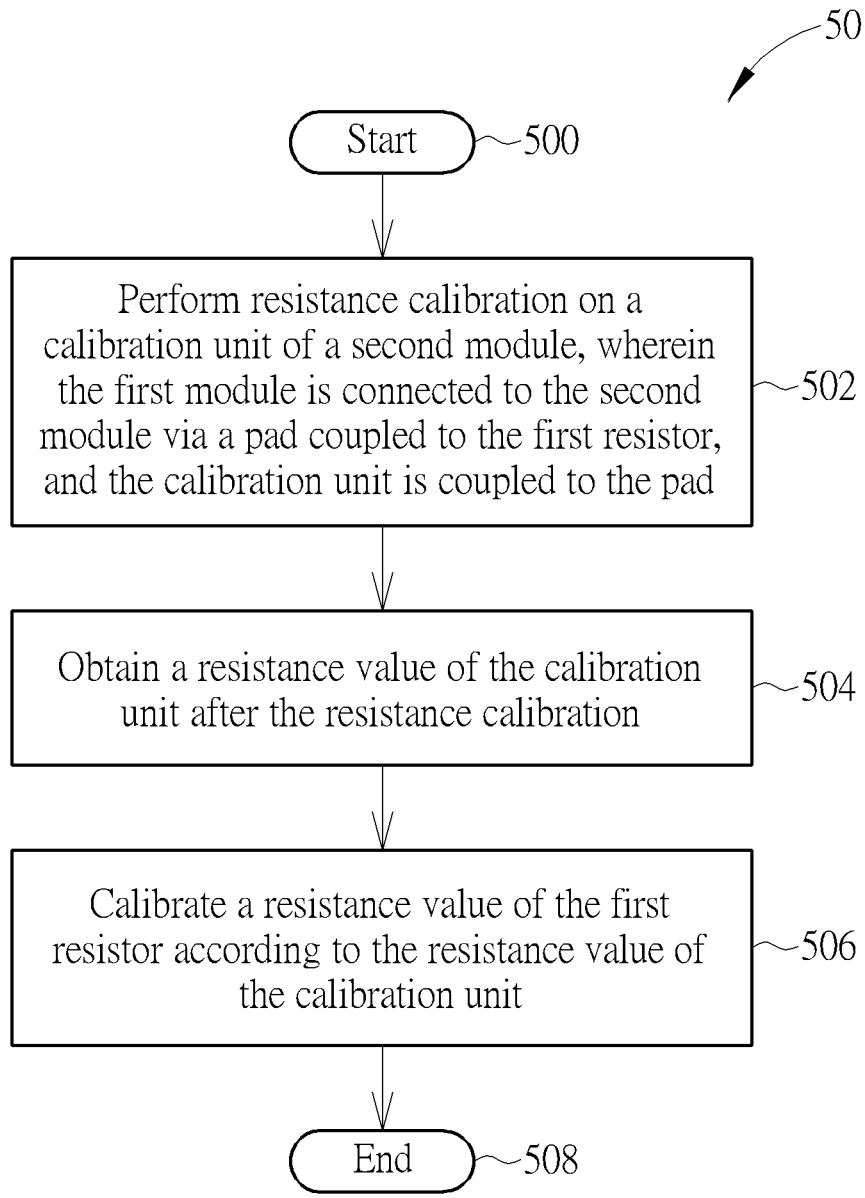
FIG. 5 is a schematic diagram of a resistance calibration process according to an embodiment of the present invention.

The above operations related to the resistance calibration of the DRAM control system 10 may be summarized into a resistance calibration process 50, as shown in FIG. 5. The resistance calibration process 50, which is utilized for calibrating a first resistor of a first module, includes the following steps:

Step 500: Start.

Step 502: Perform resistance calibration on a calibration unit of a second module, wherein the first module is connected to the second module via a pad coupled to the first resistor, and the calibration unit is coupled to the pad.

Step 504: Obtain a resistance value of the calibration unit after the resistance calibration.

Step 506: Calibrate a resistance value of the first resistor according to the resistance value of the calibration unit.

Step 508: End.

Detailed operations and alternations of the resistance calibration process 50 are illustrated in the above paragraphs, and will not be narrated herein.

In the prior art, the conventional ODT calibration method requires an external reference resistor and a corresponding dummy pad for each chip on the PCB. In contrast, the resistance calibration method and the calibration system of the present invention allow the resistance values of the first module to be calibrated according to the resistance values of a calibration unit in the second module, in order to prevent the usage of external resistor and corresponding dummy pad for the first module. Therefore, the pin number of the chip corresponding to the first module may be reduced, and the cost and area on the PCB will be saved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistance calibration method for a first resistor of a first module, the resistance calibration method comprising:

performing resistance calibration on a calibration unit of a second module, wherein the first module is connected to the second module via a pad coupled to the first resistor, and the calibration unit is coupled to the pad;

obtaining a resistance value of the calibration unit after the resistance calibration; and calibrating a resistance value of the first resistor according to the resistance value of the calibration unit.

2. The resistance calibration method of claim 1, wherein the step of calibrating the resistance value of the first resistor according to the resistance value of the calibration unit comprises:

determining a specific voltage value corresponding to a target resistance value of the first resistor;

adjusting the resistance value of the first resistor, wherein a voltage value of an output voltage generated from the pad varies in response to variation of the resistance value of the first resistor; and determining that the resistance value of the first resistor reaches the target resistance value when the voltage value of the output voltage reaches the specific voltage value.

3. The resistance calibration method of claim 2, wherein the step of determining that the resistance value of the first resistor reaches the target resistance value when the voltage value of the output voltage reaches the specific voltage value comprises:

comparing the voltage value of the output voltage with the specific voltage value via a comparator; and determining that the resistance value of the first resistor reaches the target resistance value when an output value of the comparator changes.

4. The resistance calibration method of claim 1, wherein the first resistor is a pull-up resistor or a pull-down resistor of the pad.

5. The resistance calibration method of claim 1, wherein the step of calibrating the resistance value of the first resistor according to the resistance value of the calibration unit is performed periodically.

6. The resistance calibration method of claim 1, wherein the second module is a dynamic random access memory (DRAM), and the first module is a controller of the DRAM.

7. The resistance calibration method of claim 1, wherein the first module is an output driver of a chip, and the second module is a load of the output driver.

8. The resistance calibration method of claim 1, wherein the calibration unit comprises at least one second resistor, for providing at least one reference resistance value for calibrating the resistance value of the first resistor.

9. A resistance calibration method for a plurality of first resistors of a first module, the resistance calibration method comprising:

performing resistance calibration on a plurality of calibration units of a second module, wherein the first module is connected to the second module via a plurality of pads, each of which is coupled to at least one of the plurality of first resistors, and each of the plurality of calibration units is coupled to one of the plurality of pads;

obtaining resistance values of the plurality of calibration units after the resistance calibration; and calibrating a resistance value of each of the plurality of first resistors according to the resistance value of a corresponding calibration unit among the plurality of calibration units.

10. The resistance calibration method of claim 9, wherein the step of calibrating the resistance value of each of the plurality of first resistors according to the resistance value of the corresponding calibration unit among the plurality of calibration units comprises:
- determining a specific voltage value corresponding to a target resistance value of a first resistor among the plurality of first resistors;
- adjusting the resistance value of the first resistor, wherein a voltage value of an output voltage generated from a pad coupled to the first resistor among the plurality of pads varies in response to variation of the resistance value of the first resistor; and
- determining that the resistance value of the first resistor reaches the target resistance value when the voltage value of the output voltage reaches the specific voltage value.

11. The resistance calibration method of claim 10, wherein the step of determining that the resistance value of the first resistor reaches the target resistance value when the voltage value of the output voltage reaches the specific voltage value comprises:
- comparing the voltage value of the output voltage with the specific voltage value via a comparator; and
- determining that the resistance value of the first resistor reaches the target resistance value when an output value of the comparator changes.

12. The resistance calibration method of claim 9, wherein the first resistor is a pull-up resistor or a pull-down resistor of a pad coupled to the first resistor among the plurality of pads.

13. The resistance calibration method of claim 9, wherein the step of calibrating the resistance value of each of the plurality of first resistors according to the resistance value of the corresponding calibration unit among the plurality of calibration units is performed periodically.

14. The resistance calibration method of claim 9, wherein the second module is a dynamic random access memory (DRAM), and the first module is a controller of the DRAM.

15. The resistance calibration method of claim 9, wherein the first module is an output driver of a chip, and the second module is a load of the output driver.

16. The resistance calibration method of claim 9, wherein each of the plurality of calibration units comprises at least one second resistor, for providing at least one reference resistance value for calibrating the resistance value of the first resistor.

17. A calibration system, comprising:
- a first module, comprising:
  - a first resistor to be calibrated, coupled to a pad; and
  - a calibration circuit, coupled to the first resistor; and
- a second module, comprising:
  - a calibration unit, coupled to the pad, wherein the calibration unit is calibrated by an external resistor to obtain a resistance value;
- wherein the calibration circuit calibrates a resistance value of the first resistor according to the resistance value of the calibration unit.

* * * * *